United States Patent [19]

Wada et al.

[11] Patent Number: 4,816,128

[45] Date of Patent: Mar. 28, 1989

[54] PROCESS FOR PRODUCING SUBSTRATE MEMBER FOR MAGNETIC RECORDING DISC

[75] Inventors: Toshiaki Wada, Takatsuki; Junichi Nakaoka, Amagasaki; Takayuki Ono, Hirakata, all of Japan

[73] Assignee: Sumitomo Special Metals Co., Ltd., Osaka, Japan

[21] Appl. No.: 918,078

[22] Filed: Oct. 14, 1986

[30] Foreign Application Priority Data

Oct. 14, 1985 [JP] Japan .................................. 60-229150

[51] Int. Cl.$^4$ .............................................. C23C 14/34
[52] U.S. Cl. ........................... 204/192.23; 204/192.15; 427/130; 427/255; 427/370
[58] Field of Search .................. 204/192.15, 192.22, 204/192.23, 192.32, 192.35, 192.37; 427/128, 129, 130, 255, 370

[56] References Cited

U.S. PATENT DOCUMENTS

| | | | |
|---|---|---|---|
| 3,470,020 | 9/1969 | Boudreaux et al. | 427/129 |
| 3,681,225 | 8/1972 | Genma et al. | 427/129 X |
| 4,254,189 | 3/1981 | Fisher | 427/129 X |
| 4,339,300 | 7/1982 | Noble | 204/192.3 X |
| 4,598,052 | 7/1986 | Wada et al. | 501/87 |
| 4,608,293 | 8/1986 | Wada et al. | 427/129 X |
| 4,636,420 | 1/1987 | Wada et al. | 427/129 X |
| 4,659,606 | 4/1987 | Wada et al. | 204/192.23 X |
| 4,690,846 | 9/1987 | Wada et al. | 428/64 |

FOREIGN PATENT DOCUMENTS 60-138730 7/1985 Japan .

Primary Examiner—Nam X. Nguyen
Attorney, Agent, or Firm—Burns, Doane, Swecker & Mathis

[57] ABSTRACT

A process for producing a substrate member for magnetic recording disc with improved surface state free of defects such as micropores and strain due to machining, and improved surface roughness, such substrate being obtained by first forming a glass coating layer on the surface of a substrate of an alumina-based ceramic material containing therein micropores of 5 μm or less and having a relative theoretical density of 90% or above; then, subjecting the glass coating layer on a substrate to the hot isostatic pressing treatment; and further subjecting the surface of the glass coating layer to mechano-chemical polishing to a layer thickness in a range of from 3 μm to 200 μm and the surface free from micropores and strain. Glass coating may be done by glazing or vapor deposition like sputtering.

14 Claims, 1 Drawing Sheet

PROCESS FOR PRODUCING SUBSTRATE MEMBER FOR MAGNETIC RECORDING DISC

BACKGROUND OF THE INVENTION

The present invention relates to a process for producing a substrate member for a magnetic recording disc formed of ceramic materials. More particularly, it is concerned with a process for producing a substrate member for a magnetic recording disc provided thereon with a glass coating layer having substantially no air bubbles and strain due to machining as well as having an improved surface roughness.

In general, the substrate members (or base plates) for a magnetic recording disc is required to have the following properties:

(1) an excellent surface roughness after polishing so as to achieve stable floating of the magnetic head and stable recording characteristics in association with floating height of the magnetic head as low as 0.3 micron ($\mu$m) or below;

(2) free from any projections and pinhole-like indents which are essentially attributable to the deficiency in the magnetic film formed on the surface of the substrate member;

(3) mechanical strength sufficient to withstand machining, polishing or high speed rotation during use; and (4) sufficient corrosion-resistance, weather-resistance, and heat-resistance.

Heretofore, aluminum alloys have been used as the substrate members for magnetic recording discs. However, due to the crystal anisotropy in the aluminum alloy materials, defects in these materials as well as non-metallic inclusions existing therein, such non-metallic inclusions are apt to remain on the surface of the aluminum alloy substrate in the form of protrusions, or they tend to separate away from the surface thereof to give rise to indents, even after machining and polishing, with the consequence that a surface roughness ($R_z$) of about 200 angstroms at the most could only be attained notwithstanding extensive polishing work having been carried out on it. Such surface state of the material having protrusions, indents and undulations is not satisfactory as the substrate for the high density magnetic recording disc.

That is to say, the machined quality of the surface of the magnetic disc substrate member directly affects the run-out and speed acceleration component caused by the magnetic recording disc, the signal errors of the magnetic recording medium, and so forth.

Since the aluminum alloys are metallic materials, they have a Vickers' hardness on the order of Hv 100 (in the case of ceramics, it is more than Hv 600) and a bending strength on the order of 1,000 kgf/cm$^2$ (in the case of ceramics, it is more than 4,000 kgf/cm$^2$) For that reason, as the recording density increases, more stringent requirements are imposed upon the shape and the dimensional precision thereof in respect of scratch, flaw, surface flatness and undulation, on account of which more difficulty is accompanied in its machining.

Also, in the case of the aluminum alloy substrate members, there would be a possibility of abrasive particles being packed in the indents at the surface part of the substrate member at the time of its machining by use of abrasive particles, which entails another problem; and, moreover, in order to increase the surface-corrosion-resistance and the weather-resistance as well as to prevent the substrate member from its surface contamination, a great deal of care should be taken to secure cleanliness and rust-prevention as well as to avoid contamination, etc. in the production steps of the substrate inclusive of the lathe-turning and the polishing works, as well as in the storage period thereof.

For the purpose of improving the aluminum alloy substrate members, there has so far been proposed a method, in which a film having a high hardness is formed on the surface thereof. As an example, there has been adopted a method, in which an alumite layer is formed on the surface of the aluminum alloy substrate to increase its hardness, thereby improving its abrasive machinability. However, traces of impurities (such as Fe, Mn, Si) contained in the aluminum alloys precipitate as intermetallic compounds during formation of the alumite, which are liable to bring about the surface indents after the alumite treatment.

It is extremely difficult to attempt further purification of the aluminum alloy matrix from the point of view of its production process. In addition, the aluminum alloys raise a handling problem from the standpoint of their corrosion-resistance and cleanness.

Furthermore, formation of a thin film magnetic recording medium by plating or sputtering onto the surface of the aluminum alloy poses problems in connection with the occurrence of chemical reactions and diffusion between the aluminum alloy and the magnetic thin film. There is also a problem such that, due to a heat treatment applied to the magnetic film upon its coating, deformation is caused to the aluminum alloy substrate, which would simultaneously bring about an increase in surface vibration and acceleration at the time of rotation of the substrate member (disc).

There has also been proposed a method, in which an oxide such $SiO_2$, $Al_2O_3$ or the like is formed on the aluminum alloy substrates by sputtering. This method, however, is disadvantageous in that the adhesion force between the aluminum alloy substrate and the sputtered oxide film is weak.

Alumina-based ceramic materials have become widely used in various fields due to their superiority over the aluminum alloy materials in respect of heat-resistance, wear-resistance, weather-resistance, insulation and mechanical strength. And, in order to fulfil the requirements for such magnetic disc substrate member, there is a strong demand on the alumina-based ceramic substrate member to have the surface and coated layer thereof free from any micropores and strains in association with the necessity for forming the thin film magnetic medium on the substrate member surface, and with the thinning and high densification of the recording medium.

In general, as the methods for producing the ceramic substrate member, there have been known the single-crystallization method, sintering methods wherein formed bodies (or compacts) are prepared by metal mold forming, rubber press forming, doctor blade forming, etc., and further, the hot-pressing (HP) process as well as the hot isostatic pressing (HIP) process have been known for obtaining the ceramic substrate having much more increased density. However, the single-crystallization method is not only high in production cost, but also it is difficult to produce a substrate having a large diameter. While, on the other hand, the hot isostatic pressing process and the hot pressing process are capable of producing a highly densified substrate, use of such ceramic substrate for a magnetic recording disc raises certain problems in its operational reliability such as the occurrence of drop-outs, head crush, and so on due to the minute surface defects (these methods are still liable to leave micropores of 5 um or below in the substrate) of the resulting substrate.

In general, the mechanochemical polishing method, which is applicable to the magnetic disc substrate member, etc. as the surface polishing method, has been known to be capable of precisely finishing the surface of silicon substrates, GGG crystals, ferrite, and so on without deteriorating the surface physical properties thereof. However, when this mechanochemical polishing method is applied to ceramic materials, in which micropores exist, it renders the micropores to be exposed to the surface of the ceramic material with the result that such ceramic materials are not eligible for magnetic disc substrate members, on which the thin film magnetic medium is to be coated. On the other hand, when an mechanochemical polishing method is applied to the alumina-based ceramic substrate, there arise problems such that exposure of micropores to the surface thereof and step-difference between crystal grains occur simultaneously due to the difference in the rate of chemical erosion on the surfaces of the constituent material or crystal grains.

With a view to solving, therefore, the disadvantages inherent in magnetic disc substrates composed of the ceramic materials, and to obtaining an improved ceramic type magnetic disc substrate member having excellent surface roughness and being substantially free from micropores and strains in its surface and coated layer, the present inventors have conducted strenuous studies and researche from various aspects, as the result of which they have developed a magnetic disc substrate member provided on its surface with a glass coating layer having excellent surface roughness and being substantially free from the micropores and strain due to machining, as the result of the mechanochemical polishing having been carried out on surface of the glass coating layer under particular conditions, after its coating.

However, of these glass coating layers formed on the surface of the ceramic surface by various methods, a glass coating layer formed on a disc having an outer diameter of 130 mm and an inner diameter of 40 mm, for example, contains about 100 pieces of air bubbles in the coated layer near the substrate surface, each having a diameter in a range of from 0.5 $\mu$m to 5 $\mu$m, which are sometimes exposed to the surface thereof. On account of this, when this glass-coated disc substrate member is covered with a magnetic recording medium to be made into a magnetic recording disc, such air bubbles are liable to be the cause of turning recording signals into error or noise signals with the consequence that operational reliability of the magnetic recording disc becomes poor upon its use. For the solution of such disadvantage, the air bubbles to be exposed as micropores to the surface of the glass coating layer and to be present in the coated layer itself should be reduced to 10 or less. Thus there is much desired in the art.

SUMMARY OF THE DISCLOSURE

In view of the abovementioned points, it is the primary object of the present invention to provide a method for producing a ceramic type substrate member for a magnetic recording disc which has solved the disdvantages inherent in the conventional magnetic disc substrate member composed of ceramic material, and which is provided thereon with a glass coating layer having excellent surface roughness and with its surface being substantially free from air bubbles and strain due to machining, wherein the number of air bubbles in the glass coating layer (or micropores disposed on the surface) has been remarkably decreased to improve operational reliability of the magnetic recording disc upon its use.

In more detail, the present inventors conducted various studies and researche with the purpose of finding an improved ceramic type substrate for magnetic recording discs which has excellent surface roughness and is free from micropores and strain as required for the substrate member for the magnetic disc. As the result of these efforts, they have discovered that, by coating the surface of the alumina-based ceramic material with a glass coating layer, then subjecting the glass coating layer on the ceramic substrate to hot isostatic pressing (HIP) treatment, and further subjecting the same to mechanochemical polishing under particular conditions to thereby render the glass coating layer to have an excellent surface roughness and to be substantially free from air bubbles or micropores on the surface and in the coated layer, and strain, there can be obtained an alumina-based ceramic substrate member for magnetic recording discs, which satisfies the requisite conditions for the abovementioned magnetic recording disc substrate member.

That is to say, according to the present invention in a general aspect thereof, there is provided a process for producing a substrate member for a magnetic recording disc, which comprises steps of:

(a) forming a glass coating layer on the surface of a substrate of an alumina-based ceramic material containing therein micropores with a size of 5 $\mu$m or below, and having a relative theoretical density of at least 90%;

(b) then, subjecting said glass coating layer on said substrate to hot isostatic pressing treatment to make the glass coating layer substantially free from micropores; and (c) further subjecting the surface of said glass coating layer to mechanochemical polishing to render it to have a layer thickness of 3 to 200 $\mu$m and a surface substantially free from micropores and strain.

The glass coating layer preferably has a relative difference in thermal expansion coefficient between it and the substrate of $2 \times 10^{-6}$/deg.(C) or below and a softening point of 400° C. or above.

The mechanochemical polishing is preferably conducted under a lapping pressure of from 0.05 to 2 kgf/cm$^2$ in a suspension liquid including at least one selected from the group consisting of Fe$_2$O$_3$, SiO$_2$, MgO, CeO$_2$ and Al$_2$O$_3$ in finely divided powder of a particle size of 0.1 $\mu$m or below, which is suspended in pure water at a rate of 0.1 to 50% by weight.

The term "polishing" used herein generally has a broad meaning embracing, e.g., lapping or buffing or the like finishing process such as one that uses loose fine abrasives or powders in the wet state.

The term "strain-free" denotes the state such that the affected surface layer due to processing, i.e., the Beilby layer thickness is no more than 50 angstroms as measured by an Ellipsometer, the Beilly layer thickness being preferably no more than 20 angstroms.

The term "substantially free from micropores" denotes the state such that on the surface there are micropores or indents having a diameter exceeding 0.1 micron in a number not exceeding 10 (preferably not exceeding 5).

Since the substrate member for the magnetic recording disc according to the present invention has improved surface roughness after the polishing work, there can be attained stable floating of the magnetic head and stable recording characteristics at the floating height of the magnetic head of 0.3 μm or below; further, since the glass coating layer contains therein a very small number of air bubbles, and also, since the substrate contains therein a very small number of protrusions and pinhole-like indents (namely substantially free from micropores), all of which are liable to cause the defects in the magnetic thin film to be formed on the surface of the substrate member, the tight adhesion, various recording characteristics and operational reliability of the magnetic thin film will become improved; and moreover, the substrate member possesses its mechanical strength sufficient to be durable against high speed rotation during its machining, polishing or use, and is also excellent in its resistance to corrosion, weathering, and heat. Hence it satisfies all the requisite conditions for the substrate member. Here the term "substantially free from micropores" denotes that there are no more micropores (indents) than 10 (preferably 5) exposed to the surface having a size exceeding 0.1 μm in the whole area of the coating layer which is attainable by the HIP treatment.

The foregoing object, other objects as well as specific construction and function of the substrate for the magnetic recording disc according to the present invention will become more apparent and understandable from the following detailed description thereof, when read in conjunction with the accompanying drawing.

BRIEF DESCRIPTION OF THE ACCOMPANYING DRAWING

In the drawing:

FIGS. 1A and 1B are graphical representations respectively indicating the surface state of the coating film after it has been formed on the surface of a substrate and polished, and the surface state of the substrate before the coating, both being measured by a thin film step-difference measuring apparatus ("TALYSTEP") in accordance with preferred examples of the present invention.

DETAILED DESCRIPTION OF THE PREFERRED EMBODIMENTS

Figure 1A:
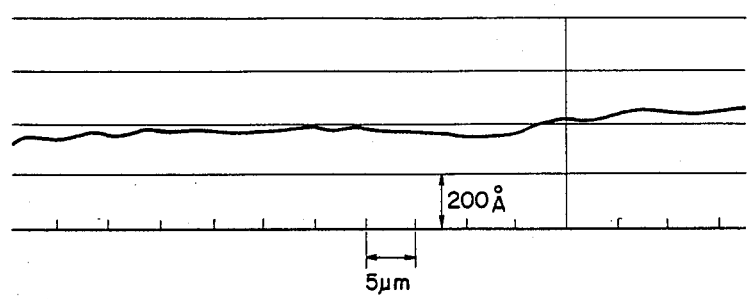

According to the present invention, the alumina-based ceramic material contains $Al_2O_3$ as the principal component and metal oxides as the additional components. This material can be shaped by metal mold forming, extrusion forming, injection forming, sheet forming, and other methods, followed by sintering the shaped green body. When the micropores in the alumina-based ceramic material exceed 5 μm, there tend to occur air bubbles in this part of the micropores to deteriorate the precision in the film. On account of this, the micropores should desirably have a size of 5 μm or below, or preferably 3 μm or below.

The reason for determining the relative theoretical density of the alumina-based ceramic material to be 90% or above is to suppress the abovementioned micropores to a size of 5 μm or below, while a relative theoretical density of 96% or more is preferred.

The glass material to be used for forming the glass coating layer should be such ones that satisfy the difference in the thermal expansion coefficient between it and the substrate of $2 \times 10^{-6}$/deg.(C) or below and a softening point of 400° C. or above. Examples of such glass material are: soda lime glass (based on $Na_2O$-$CaO$-$SiO_2$), lead glass (based on $PbO$-$SiO_2$), barium glass (based on $BaO$-$Al_2O_3$-$SiO_2$), boro-silicate glass (based on $Na_2O$-$B_2O_3$-$SiO_2$), alumina silicate glass (based on $Al_2O_3$-$SiO_2$), lithia alumina silicate glass (based on $Li_2O$-$Al_2O_3$-$SiO_2$), and other silicate glasses; lead borate glass (based on $PbO$-$B_2O_3$-$SiO_2$) alumina borate glass (based on $Al_2O_3$-$B_2O_3$) and other borate glasses; alumina phosphate glass (based on $Al_2O_3$-$P_2O_5$); and so forth.

The reason for setting the softening point of the glass according to the present invention at 400° C. or above is that, with the softening point of below 400° C., the thermal expansion coefficient becomes too large to conform with that of the ceramic substrate, and chemical stability becomes undesirably poor.

When the difference in the thermal expansion coefficient between this glass coating layer and the abovementioned substrate [in a temperature range from 20° C. to the strain point (a temperature corresponding to a viscosity of the glass of about $10^{14.5}$ poises)] becomes large, the mutual stress between them increases to bring about the problems of warping and fracture of the glass coating layer. It is therefore necessary that the relative difference in the thermal expansion coefficient between the glass coating layer and the ceramic substrate be $2 \times 10^{-6}$/deg.(C) or below. Moreover, since it is preferable that compression stress be imposed on the surface of the glass coating layer, the thermal expansion coefficient of the material for the coating film should desirably be lower than that of the material for the substrate. Furthermore, it is the most preferable that thermal expansion coefficient (20° C. to strain point) between the glass coating layer and the abovementioned ceramic substrate has the identical trend.

After formation of the glass coating layer on the surface of the substrate, it is subjected to the hot isostatic pressing treatment, and thereafter the glass coating layer is further subjected to the polishing work. The polishing work on the glass coating layer may be successfully effected by mechanochemical polishing (MCP) under a lapping pressure in a range of 0.05 to 2 kg/cm² in a suspension liquid including at least one kind of substrate selected from the group consisting of $Fe_2O_3$, $SiO_2$, $MgO$, $CeO_2$ and $Al_2O_3$ in finely divided powder form having a particle diameter of 0.1 μm or below, which is suspended in pure water at a rate of from 0.1% by weight to 50% by weight. When the particle size exceeds 0.1 μm, flaws are formed on the surface of the glass coating layer to unfavorably deteriorate the surface roughness. On the other hand, when the content of the finely divided powder in the suspension liquid does not reach 0.1% by weight, the polishing effect is poor, and, when its content exceeds 50% by weight, the polishing resistance increases with increase in viscosity of the suspension liquid due to the increased amount of the finely divided powder. Hence the content of such very fine powder to be present in the suspension liquid is set in a range of from 0.1% by weight to 50% by weight. Most of such powders are synthetic and may be crystalline, while some of them ($Al_2O_3$, $CeO_2$) may be particulated powder of the natural products.

Pure water should not contain therein any organic contaminants and floating substances, for which ion-exchanged water and distilled water are suited.

For the lapping device, a soft metal such as lead, solder alloys, tin, and so forth, or hard cloth are suitable.

With the lapping pressure not reaching 0.05 kgf/cm$^2$, the required surface roughness of the glass coating layer cannot be obtained, and moreover, the machining efficiency thereon is poor. On the contrary, when the lapping pressure exceeds 2 kgf/cm$^2$, it would be good with respect to the machining efficiency itself, but the polishing precision becomes poor, hence the lapping pressure is set in a range of from 0.05 to 2 kgf/cm$^2$.

Thickness of the glass coating layer after the mechanochemical polishing should be such that it uniformly covers the alumina substrate without its being exposed to the surface. Considering the precision in the polishing work, the film thickness is required to be 3 μm or more. However, when it exceeds 200 μm, there is an apprehension such that a large strain would be created within the substrate member due to a stress caused by the difference in the thermal expansion coefficient between the glass coating film and the substrate. Hence the thickness of the glass coating layer is set in a range of from 3 μm to 200 μm.

The surface roughness ($R_z$) of the glass coating layer should be 180 angstroms or less because over 180 angstroms, the recording characteristics of the magnetic recording disc becomes deteriorated. However, according to the preferred embodiments of present invention, a surface roughness of 80 angstroms, or more favorably 40 angstroms or less or 30 angstroms or less can be achieved.

The alumina-based ceramic material according to the present invention is principally composed, in the case of forming the glass coating layer by the sputtering method, of Al$_2$O$_3$ such as Al$_2$O$_3$, Al$_2$O$_3$-TiC system, Al$_2$O$_3$-TiO$_2$ system, Al$_2$O$_3$-Fe$_2$O$_3$-TiC system, and so forth (at a rate of 50% by weight, or preferably 70% by weight or besides the above, those additionally containing metal oxides.

Typical of the preferred alumina base ceramic materials embrace the following:

(1) sintered alumina (preferably purity of 96% or more)
(2) Al$_2$O$_3$—TiC—TiO$_2$ system
    (e.g., JP-Patent-Kokai Publication No. 57-135772)
  (i) TiC + TiO$_2$ = 30-50 wt %, and
    Al$_2$O$_3$ = balance
  (ii) (i) provided that
    [TiO$_2$/(TiC + TiO$_2$)] × 100 = ⎤ : 100 parts by wt
    5-15 wt %
    at least one of MgO, NiO, Cr$_2$O$_3$ and ZrO$_2$: 0.5:5 parts by wt
    Y$_2$O$_3$: 0.05-2 parts by wt
(3) Al$_2$O$_3$—TiO$_2$ system
    (e.g., JP-Patent-Kokai Publication No. 57-198578)
  (i) TiO$_2$ = 20-60 wt %, and
    Al$_2$O$_3$ = balance
  (iii) (i) = 100 parts by wt
    at least one of CaO, MgO and Y$_2$O$_3$: 0.5-5 parts by wt
    ZrO$_2$: 0.5-10 parts by wt
(4) Al$_2$O$_3$—Fe$_2$O$_3$—TiC system
    (e.g., JP-Patent-Kokai Publication No. 58-1854)
  (i) TiC = 10-30 wt %, and
    Al$_2$O$_3$—Fe$_2$O$_3$ solid solution* = balance
  (ii) (i) = 100 parts by wt
    at least one of CaO, MgO and Y$_2$O$_3$ = 0.5-5 parts by wt
    ZrO$_2$ = 0.5-10 parts by wt

*N.B. Al$_2$O$_3$:Fe$_2$O$_3$ = 1:1 by mol

In the case of forming the glass coating layer by the glazing method, the alumina-based ceramic material should preferably be composed of Al$_2$O$_3$, Al$_2$O$_3$-TiO$_2$ system, and so forth as the principal component or besides those additionally containing metal oxides. These alumina-based ceramic materials may preferably be shaped by the metal mold forming, the rubber press forming, the doctor blade forming, or other forming methods, followed by the press sintering treatmnet of the shaped body such as hot press (HP) process or the hot isostatic pressing (HIP) process. The alumina-based ceramic composition may also contain therein known type of grain growth inhibitors such as MgO, NiO, Cr$_2$O$_3$, etc. and other sintering aids.

The material for the alumina-based ceramic substrate should preferably have an average crystal grain size of 5 μm or less, and a relative theoretical density (density relative to the theoretical density) of 90% or above, which is commercially readily available as the standard product with a low cost.

In the present invention, the formation of the glass coating layer onto the alumina-based ceramic substrate is done by various coating methods such as glazing method; vapor deposition techniques like sputtering method, vacuum deposition method, ion-plating method; and so forth, the methods enabling a uniform film thickness to be obtained and the surface polishing to be effected.

It may be worthy of noting that, at the time of formation of the glass coating layer, if an SiO$_2$ film is first formed and then a required glass coating is effected, the adhesive strength and the wetting property between the substrate and the coating glass can be improved.

The glass to be used for the sputtering method should preferably have a high melting point, out of those various glasses as mentioned in the foregoing, of 500° C. or more, (preferably 700° C. or more) because of its higher target strength and its capability of increasing a load voltage to the target.

The glass to be used for the glazing method should preferably have its softening point in a range of from 400° C. to 850° C. (preferably 500° C. or more). With the softening point not reaching 400° C., the thermal expansion coefficient becomes too large to meet the thermal expansion coefficient of the substrate, and the chemical stability of the glass coating layer is unfavorably sacrificed. On the contrary, when the softening point exceeds 850° C., the heat treatment temperature unfavorably becomes high and above 900° C. too high.

The thickness of the glass coating film before the polishing work should desirably be in a range of from 5 μm to 220 μm. This range of thickness is essential for obtaining a uniform film thickness and enabling the surface polishing work to be done satisfactorily. This thickness range also serves to prevent strain from occurring within the substrate due to the difference in the thermal expansion coefficients between the glass coating layer and the substrate.

The thickness of the glass coating layer to be formed on the alumina-based ceramic material according to the present invention may be selected depending on its purpose and the class of material to be used. Where the glazing method is employed for coating, difficulty is involved in maintaining the uniform thickness of the coating, if the coating layer thickness is below 10 μm. It is also difficult to make the coating layer surface pore-free and strain-free, and to render it to have the required surface roughness by means of the mechanochemical polishing process under the aforementioned conditions. With a coating layer thickness exceeding 220 μm, there would occur apprehension such that a difference in the thermal expansion coefficient between the glass coating layer and the alumina substrate gives rise to a great amount of stress which, in turn, possibly leads to a large strain within the resultant substrate member. It is therefore required in this case, that the coating layer thickness be in a range of from 10 μm to 220 μm.

Where the sputtering method is adopted for coating, difficulty is involved in maintaining the uniform thickness of the coating layer, if the film thickness is below 5 μm. It is also difficult to make the film surface pore-free and strain-free, and to render it to have the required surface roughness by means of the mechanochemical polishing process. With a film thickness exceeding 220 μm, there would occur apprehension such that a difference in the thermal expansion coefficient between the glass coating layer and the alumina substrate gives rise to stress which, in turn, possibly leads to a great strain in the resultant substrate member. It is therefore required that film thickness be in a range of from 5 μm to 220 μm. Further, from the standpoint of the film-forming rate, the coating layer thickness is preferably in a range of from 15 μm to 25 μm.

In consideration of precision in the polishing work, the thickness of the coating film after the mechanochemical polishing work may be in a range of from 3 μm to 200 μm in the case of adopting the glazing method, while it is in a range of from 3 μm to 200 μm, or more preferably from 10 μm to 20 μm in the case of adopting the sputtering method.

The substrate member, on the surface of which the glass coating layer has been formed, is then subjected to the hot isostatic pressing (HIP) treatment. This treatment should desirably be carried out in an inactive gas atmosphere such as Ar, $N_2$, etc. (preferably with a certain amount of oxygen) at a temperature corresponding to viscosity of the glass material of from $10^6$ to $10^8$ poises, and under a pressure of from 10 kgf/cm$^2$ to 2,000 kgf/cm$^2$. The oxygen partial pressure may be 0.01–30% more preferably 0.1–22%, most preferably up to 10%.

At a temperature below that corresponding to the viscosity of the glass of $10^8$ poises, the glass has less fluidity, hence the air-bubble-reducing-effect is small. On the contrary, at a temperature higher than that corresponding to the viscosity of the glass of $10^6$, the viscosity thereof becomes excessively increased to be likely to impair the shape of the glass coating layer. Thus the temperatures corresponding to $10^6$ to $10^8$ poises are preferred, while $10^5$ to $10^9$ poises may be acceptable. Furthermore, under a pressure below 10 kgf/cm$^2$, the air-bubble-reducing-effect is small, and, when it exceeds 2,000 kgf/cm$^2$, there would be invited an unfavorable increase in the installation cost for the pressing machine. Preferably, the pressure is 100 to 800 kgf/cm$^2$.

The HIP treatment under said suitable conditions is usually conducted for about 10 min. or more, up to 3 hours, preferably for 10–60 min.

The resultant glass coating layer surface has a Beilby layer thickness of less than 50 angstroms, preferably 20 angstroms.

Since the substrate member for the magnetic recording disc according to the present invention is excellent in its surface roughness after its polishing work, there can be obtained stable floating of the magnetic head as well as stable recording characteristics at the floating height of the magnetic head of 0.3 μm or below. Further, since the substrate contains a very small number of protrusions and pinhole-like indents, and also the glass coating layer contains therein a very small number of air bubbles, all of which are liable to cause the defects in the magnetic thin film to be formed on the surface of the substrate, the tight adhesion, various recording characteristics, and operational reliability of the magnetic thin film will become improved; and moreover, the substrate member possesses a mechanical strength sufficient to be durable against high speed rotation during its machining, polishing or use, and is also excellent in its resistance to corrosion, weathering, and heat. Hence it satisfies all the requisite conditions for the substrate member.

Where the alumina-based ceramic substrate member according to the present invention is used as the magnetic disc for recording on both surfaces, the glass coating layer is formed on both surfaces of the alumina-based ceramic material, and the glass coating layers thus formed on both surfaces are subjected to simultaneous mechanochemical polishing work and to thereby offset the internal stress therein, whereby the substrate having an excellent surface flatness and surface roughness, and being substantially free from micropores and strain is obtained.

The substrate member for the magnetic recording disc according to the present invention, which is composed of an alumina-based ceramic with a predetermined glass coating layer being formed on it, followed by the hot isostatic pressing treatment applied thereto, has various advantages such that control of precision in its shaping during the polishing work can be done more easily than that of the conventional disc substrate; that there is no necessity for paying particular attention to the corrosion-resistant property and the weather-resistant property of the substrate per se; and that contamination of its surface can be removed by sputter-cleaning at the time of forming the glass coating layer by the sputtering technique.

Further, in contrast to the fact that the conventional aluminum alloy substrates leave on their surface a layer affected by machining, the alumina-based ceramic substrate member according to the present invention has such advantage that no difference in strain is brought about on its surface by the stress occurred between the surface and the substrate bulk body due to the mechanochemical polishing. Hence there takes place no transfer of the strain onto the magnetic thin film to be coated on the substrate member.

In more detail, since the glass coating layer is provided on the surface of the alumina substrate, the crystal state in the glass coating layer is in a uniform amorphous structure, and, moreover, no air bubbles would remain in the glass coating layer due to the hot isostatic pressing treatment, whereby no strain by the machining occurs from the mechanochemical polishing work. By use of such magnetic disc substrate member according to the present invention, it becomes possible to produce a high density magnetic disc recording medium of high operational reliability. In addition, there may be used as the alumina-based ceramic material a standard product having a relative theoretical density of no less than 90%, which contributes to an industrialized mass-production of the substrate.

With a view to enabling those persons skilled in the art to put the present invention into practice, a couple of preferred examples are presented in the following.

EXAMPLE 1

As a substrate, use was made of an alumina-based ceramic disc plate having a diameter of 130 mm and a thickness 1.7 mm. The substrate was composed of 96% by weight of $Al_2O_3$, which was subjected to the hot isostatic pressing treatment after the compression-molding. It contained therein micropores, each having a size of 5 μm or below, had an average crystal grain size of 4.0 μm, a relative theoretical density of 97% and a thermal expansion coefficient of $77 \times 10^{-7}$/deg.(C).

Subsequently, the surface of the abovementioned alumina-based ceramic substrate was polished precisely to the surface roughness of 0.2 μm or below by means of the precision lapping method.

On the other hand, $PbO_2$ $SiO_2$-$B_2O_3$-based glass (60% by weight of PbO, 30% by weight of $SiO_2$, and 10% by weight of $B_2O_3$) having a thermal expansion coefficient (20° C. to strain point) of $65 \times 10^{-7}$ deg.(C), a softening point of 565° C., and an average particle size passing through a 300-mesh sieve was made into a pasty form. The paste was then applied onto the polished surface of the substrate to a thickness of 100 μm by the spin-coating method at a number of revolution of 800 rpm, after which it was subjected to glass coating in air at a temperature of 1,050° C. for four hours.

The rate of the temperature elevation at the time of the glass coating was 500° C./hr.. The cooling rate was 500° C./hr. until the strain point, whereat the glass-coated substrate was maintained for one hour to remove the strain, after which it was gradually cooled. The resulting glass coating layer had a thickness of 60 μm.

Then, the alumina-based ceramic disc plate provided thereon with the glass coating layer was subjected to hot isostatic pressing treatment in an argon atmosphere with 1% oxygen partial pressure, at a temperature of 600° C. (a temperature corresponding to viscosity of the glass of $10^7$ poises), and under a pressure of 500 kgf/cm² for 30 min.

In the next place, the coating layer was subjected to polishing work in a suspension liquid including $CeO_2$ in finely divided powder form having a particle size of 0.1 μm, which was suspended in pure water at a rate of 10% by weight, under a lapping pressure of 0.5 kgf/cm² by use of a cloth lap as a lapping device, thereby finishing the glass coating layer to the surface roughness ($R_z$) of 40 angstroms. In this case, allowance for the polishing was 20 μm and the surface flatness was 1 μm. Also, no air bubbles whatsoever could be observed in the glass coating layer.

Figure 1B:
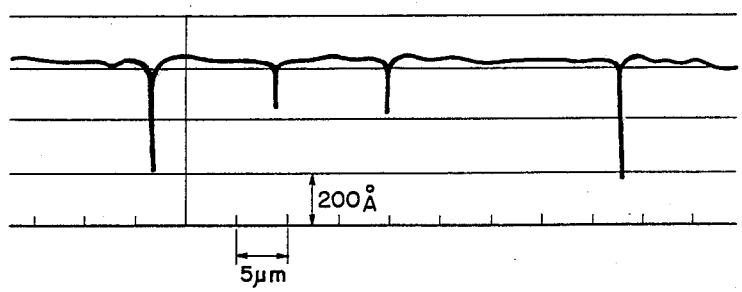

By means of a thin film step-difference measuring apparatus having a contact stylus of 0.1 μm in radius ("TALYSTEP" analyzer), the surface state of the glass coating layer after the abovementioned polishing was measured. FIG. 1A indicates the result of the measurement. In the same manner, the surface state of the substrate prior to the glass coating was measured, the result of which is shown in FIGS. 1B From FIGS. 1A and 1B, it is apparent that the micropores in the surface of the alumina-based glass coated ceramic substrate have been eliminated therefrom by the polishing work of the glass coating layer after it was subjected to the hot isostatic pressing treatment, whereby the surface was finished to have its roughness ($R_z$) of 40 angstroms.

Furthermore, from counting of the defects such as air bubbles, foreign substances, protrusions, etc. existing in the surface of the polished glass coating layer, it has been revealed that, for the glass coating layer before the hot isostatic pressing treatment, they were in a range of from 50 to 150 pieces per sheet, especially in nearly the alumina substrate surface; while, for the glass coating layer after the hot isostatic pressing treatment, they are reduced to 5 to 10 pieces per sheet (about 3.8–7.5 pieces/100 cm²). Here the defects having a diameter exceeding 0.1 μm were counted. The adhesion test showed no separation up to a load of 1000 g). The Beilby layer thickness was measured by an Ellipsometer to show less than 20 angstroms.

EXAMPLE 2

As a substrate, use was made of an $Al_2O_3$-based ceramic substrate having a diameter of 90 mm and a thickness of 1.5 mm. The substrate was composed of 99.5% by weight of $Al_2O_3$, was subjected to the hot isostatic pressure treatment after it has been shaped. It contained therein micropores, each having a size of 5 μm or below, had an average crystal grain size of 4 μm, a relative theoretical density of 97%, and a thermal expansion coefficient (20° C. to 510° C.) of $77 \times 10^{-7}$/deg.(C).

Subsequently, the surface of the abovementioned $Al_2O_3$-based ceramic substrate was precisely polished to surface roughness of 200 angstroms or below by means of the precision lapping method.

Using a target plate having a diameter of 350 mm and a thickness of 6 mm, which was made of a BaO-$SiO_2$-based glass (composed of 30% by weight of BaO, 50% by weight of $SiO_2$ with the balance being $K_2O$, $Na_2O$ etc.) having a thermal expansion coefficient (20° C. to 510° C.) of $74 \times 10^{-7}$/deg.(C), a softening point of 850° C., and a strain point of 670° C., the sputtering was carried out onto the abovementioned substrate in a high frequency sputtering device after an argon pressure for the sputtering reached a value of $1 \times 10^{-5}$ mbar through evacuation. For the cleaning of the surface of the substrate, the surface layer was removed by a thickness of about 500 angstroms by sputter-cleaning.

The electric power imparted for normal sputtering was 5 kW. A negative bias (−100 V) was applied to the side of the substrate. Step coverage was attempted on the ceramic pore portions by the resulting bias effect, whereby glass was also deposited on these pore portions. In this case, the sputtered film had a surface roughness of 500 Å.

By the way, according to the conventional sputtering method for oxides, the rate of sputtering was so slow that a prolonged period of time was required for completion of the film deposition. However, by setting a distance between electrodes at as short as 40 mm and by increasing the electric power to be imparted across the electrodes, it took 400 minutes for the formation of the coating layer to a thickness of 20 μm and at a rate of 500 angstroms/min.

The alumina-based ceramic disc plate with the glass coating film having been provided thereon was then subjected to hot isostatic pressing treatment in an argon atmosphere with 1% oxygen partial pressure, at a temperature of 800° C. (a temperature corresponding to a viscosity of the glass material of $10^8$ poises), and under a pressure of 500 kgf/cm² for 45 min.

Subsequently, the sputter-coated film was polished in a suspension liquid including $SiO_2$ in finely divided powder form having a particle size of 0.01 μm, which was suspended in pure water at a rate of 5% by weight, under a lapping pressure of 0.5 kgf/cm², by use of a tin lapping device, thereby finishing the surface of the glass coating layer to have a surface roughness ($R_z$) of 40 angstroms. In this case, allowance for the polishing was 5 μm and the surface flatness was 1 μm. Also, no air bubbles whatsoever could be observed in the glass coating layer. In this instance, the counting of the surface defects revealed that they were 30 to 80 pieces per sheet for the glass coating layer prior to the hot isostatic pressing treatment, while they were reduced to about 5 pieces per sheet (about 3.8 pieces/100 cm$^2$) for the glass coating layer after the hot isostatic pressing treatment. The adhesion test like in Example 1 showed no separation. The Beilby layer measured showed less than 20 angstroms.

By means of the thin film step-difference meter ("TALYSTEP" analyzer) having a contact stylus of 0.1 μm in radius, the surface state of the glass coating film after the polishing and the surface state of the substrate prior to the glass coating were measured, whereupon the results as shown in FIGS. 1A and 1B, respectively, were obtained.

EXAMPLE 3

As a substrate, use was made of an alumina-based ceramic disc plate having a diameter of 95 mm and a thickness 1.2 mm. The substrate was composed of 92% by weight of $Al_2O_3$ with the balance being sintering aids, which was subjected to the hot isostatic pressing treatment after the compression-molding. It contained therein micropores, each having a size of 5 μm or below, had an average crystal grain size of 4.0 μm, a relative theoretical density of 97% and a thermal expansion coefficient of $77 \times 10^{-7}$/deg.(C).

Subsequently, the surface of the abovementioned alumina-based ceramic substrate was polished precisely to surface roughness of 0.2 μm or below by means of the precision lapping method.

The resultant substrate was placed in a high frequency sputtering apparatus, evacuated to an Ar pressure of $1 \times 10^{-3}$ m bar, and subjected to reverse sputtering to remove its surface layer in a depth of about 300 angstroms for cleaning. Then the cleaned substrate was subjected to sputtering by using a $SiO_2$ target plate having a size of a 350 mm diameter and a 6 mm thickness by applying a power of 3 kW and applying a negative bias of −80 V on the substrate to form a $SiO_2$ coating layer of 0.1 μm in thickness.

On the other hand, a $CaO-BaO-SiO_2$ based glass (15% by weight of CaO, 30% by weight of BaO, and 50% by weight of $SiO_2$) having a thermal expansion coefficient (20° C. to strain point) of $65 \times 10^{-7}$ deg.(C), a softening point of 830° C., and an average particle size passing through a 300-mesh sieve was made into a pasty form. The paste was then applied onto the $SiO_2$ layer of the substrate to a thickness of 800 μm by the spin-coating method at a number of revolution of 800 rpm, after which it was subjected to glass coating in the air at a temperature of 1,200° C. for one hour.

The rate of the temperature elevation at the time of the glass coating was 500° C./hr. The cooling rate was 500° C./hr. until the strain point, whereat the glass-coated substrate was maintained for one hour to remove the strain, after which it was gradually cooled. The resulted glass coating layer had a thickness of 50 μm.

Then, the alumina-based ceramic disc plate provided thereon with the glass coating layer was subjected to hot isostatic pressing treatment in an argon atmosphere with 0.5% oxygen partial pressure, at a temperature of 870° C. (a temperature corresponding to viscosity of the glass of $10^7$ poises), and under a pressure of 700 kgf/cm$^2$ for 45 min.

In the next place, the coating layer was subjected to the polishng work in a suspension liquid including MgO in finely divided powder form having a particle size of 0.1 μm, was suspended in pure water at a rate of 5% by weight, under a lapping pressure of 0.2 kgf/cm$^2$ by use of a cloth lap as a lapping device, thereby finishing the glass coating layer to the surface roughness ($R_z$) of 30 angstroms. In this case, allowance for the polishing was 20 μm and the surface flatness was 1.5 μm. Also, no air bubbles whatsoever could be observed in the glass coating layer.

In the same manner as in Example 1 the surface state of the glass coating layer after the abovementioned polishing was measured. Similar result was obtained like FIG. 1A.

The counted defects were less than 10. Good adhesion was observed, and the Beilby layer thickness was less than 20 angstroms.

As is apparent from the foregoing preferred examples, the substrate member for the magnetic recording disc according to the present invention has substantially no micropores, protrusions and pinhole-like indents which are liable to cause the defects in magnetic thin film to be formed on the substrate surface, and also the glass coating layer deposited on the surface of the substrate is also free from air bubbles. Hence improvement can be attained in the tight adhesion, various recording characteristics and operational reliability of the magnetic thin film.

Although, in the foregoing, the present invention has been described in specific details in conjunction with a couple of preferred examples thereof, it should be noted that these examples are illustrative alone and not so limitative, and that any changes and modifications may be made in the materials used and other processing conditions by those persons skilled in the art within the spirit and scope of the invention as recited in the appended claims.

What is claimed is:

1. A process for producing a substrate member for magnetic recording disc, which comprises:
    (a) forming a glass coating layer on the surface of a substrate of an alumina-based ceramic material containing therein micropores with a size of 5 μm or below, and having a relative theoretical density of at least 90%;
    (b) then, subjecting said glass coating layer on said substrate to hot isostatic pressure treatment at a temperature corresponding to a viscosity of the glass material of $10^6$ to $10^8$ poises under conditions sufficient to make the glass coating layer substantially free from micropores; and
    (c) further subjecting the surface of said glass coating layer to mechanochemical polishing to obtain a layer thickness of 3 to 200 μm and a surface substantially free from the micropores and strain.

2. A process for producing a substrate member for magnetic recording disc, as set forth in claim 1, wherein said hot isostatic pressing treatment is effected under a pressure of 10 to 2,000 kgf/cm$^2$.

3. A process for producing a substrate member for magnetic recording disc as set forth in claim 1, wherein an $SiO_2$ layer is interposed between said alumina-based ceramic substrate and said glass coating layer.

4. A process for producing a substrate member for magnetic recording disc, as set forth in claim 1, wherein the difference between the thermal expansion coefficient of said glass coating layer and the thermal expansion coefficient of said alumina-based ceramic substrate is $2\times10^{-6}$/deg. (C) or below and the glass material of said glass coating layer has a softening point of 400° C. or above.

5. A process for producing a substrate member for magnetic recording disc, as set forth in claim 1, wherein said glass coating layer is formed by a method selected from the glazing method and vapor deposition techniques.

6. A process for producing a substrate member for magnetic recording disc, as set forth in claim 1, wherein said glass coating layer has a layer thickness of 5 to 220 $\mu$m prior to the mechanochemical polishing.

7. A process for producing a substrate member for magnetic recording disc, as set forth in claim 1, wherein said glass coating layer prior to the mechanochemical polishing is formed by the glazing method with a layer thickness thereof ranging from 10 to 220 $\mu$m.

8. A process for producing a substrate member for magnetic recording disc, as set forth in claim 1, wherein said glass coating layer prior to the mechanochemical polishing is formed by the sputtering method with a layer thickness thereof ranging from 5 to 220 $\mu$m.

9. A process for producing a substrate member for magnetic recording disc, as set forth in claim 8, wherein said glass coating layer prior to the mechanochemical polishing has a layer thickness of 15 to 25 $\mu$m.

10. A process for producing a substrate member for magnetic recording disc, as set forth in claim 1, wherein said glass coating layer is formed by the glazing method, and has its layer thickness after the mechanochemical polishing in a range of 3 to 200 $\mu$m.

11. A process for producing a substrate member for magnetic recording disc, as set forth in claim 1, wherein said glass coating layer is formed by the sputtering method, and has its layer thickness after the mechanochemical polishing in a range of 10 to 20 $\mu$m.

12. A process for producing a substrate member for magnetic recording disc, as set forth in claim 1, wherein said mechanochemical polishing is effected in a suspension liquid including finely divided polishing powder having a particle size of 0.1 $\mu$m or below, which is suspended in pure water.

13. A process as set forth in claim 12, wherein said polishing powder is contained in an amount of 0.1 to 50% by weight and is at least one selected from the group consisting of $Fe_2O_3$, $SiO_2$, MgO, CeO and $Al_2O_3$.

14. A process as set forth in claim 13, wherein the mechanochemical polishing is conducted under a lapping pressure of 0.05 to 2 kgf/cm$^2$.

* * * * *